(12) United States Patent
Den Hoedt et al.

(10) Patent No.: US 11,742,173 B2
(45) Date of Patent: Aug. 29, 2023

(54) INTEGRATED OPTICAL AND CHARGED PARTICLE INSPECTION APPARATUS

(71) Applicant: DELMIC IP B.V., Delft (NL)

(72) Inventors: Sander Den Hoedt, Delft (NL); Jacob Pieter Hoogenboom, Delft (NL)

(73) Assignee: DELMIC IP B.V., Delft (NL)

( * ) Notice: Subject to any disclaimer, the term of this patent is extended or adjusted under 35 U.S.C. 154(b) by 98 days.

(21) Appl. No.: 17/440,025

(22) PCT Filed: Mar. 18, 2020

(86) PCT No.: PCT/NL2020/050179
§ 371 (c)(1),
(2) Date: Sep. 16, 2021

(87) PCT Pub. No.: WO2020/190136
PCT Pub. Date: Sep. 24, 2020

(65) Prior Publication Data
US 2022/0172921 A1 Jun. 2, 2022

(30) Foreign Application Priority Data
Mar. 18, 2019 (NL) ...................................... 2022756

(51) Int. Cl.
*H01J 37/20* (2006.01)
*H01J 37/22* (2006.01)

(52) U.S. Cl.
CPC ............ *H01J 37/20* (2013.01); *H01J 37/226* (2013.01); *H01J 2237/002* (2013.01)

(58) Field of Classification Search
CPC .... H01J 37/20; H01J 37/226; H01J 2237/002; H01J 2237/2001; H01J 2237/2004;
(Continued)

(56) References Cited

U.S. PATENT DOCUMENTS 8,602,648 B1 * 12/2013 Jacobsen .................. G21K 7/00
378/208
9,142,384 B2 * 9/2015 Schampers ............. H01J 37/20
(Continued)

FOREIGN PATENT DOCUMENTS

WO    2012008836 A2    1/2012
WO    2013151421 A2    10/2013
(Continued)

OTHER PUBLICATIONS

International Search Report and Written Opinion from PCT Application No. PCT/NL2020/050179, dated Jun. 12, 2020.
(Continued)

*Primary Examiner* — David A Vanore
(74) *Attorney, Agent, or Firm* — Workman Nydegger

(57) ABSTRACT

The invention relates to an apparatus and a method for inspecting a sample. The apparatus includes a sample holder for holding the sample, at least the sample holder comprises a cooling system which is configured for cooling at least the sample, preferably to cryogenic temperatures; a charged particle exposure system includes an assembly for projecting a focused beam of primary charged particles onto the sample held by the sample holder; and a light optical microscope. The sample holder includes a sheet of a scintillator material, and the sample holder is configured to position the sample in between the charged particle optical column and the sheet of the scintillator material. The light optical microscope includes a detection system configured for acquiring an optical image of at least a part of the sheet of the scintillator material.

20 Claims, 12 Drawing Sheets

(58) Field of Classification Search
CPC ..... H01J 2237/2443; H01J 2237/24455; H01J 2237/2802; H01J 2237/2808; H01J 37/28
See application file for complete search history.

(56) References Cited

U.S. PATENT DOCUMENTS

| | | | |
|---|---|---|---|
| 9,715,992 B2* | 7/2017 | Hoogenboom | H01J 37/222 |
| 10,651,009 B2* | 5/2020 | Hoogenboom | H01J 37/21 |
| 2010/0025579 A1* | 2/2010 | Bilhorn | H01J 37/26 250/310 |
| 2013/0248167 A1 | 9/2013 | Lerou et al. | |
| 2015/0108350 A1* | 4/2015 | Hoogenboom | H01J 37/28 250/307 |
| 2015/0262784 A1* | 9/2015 | Hoogenboom | H01J 37/228 250/307 |
| 2017/0123198 A1 | 5/2017 | Singer et al. | |
| 2017/0221675 A1* | 8/2017 | Hoogenboom | H01J 37/20 |
| 2017/0271126 A1 | 9/2017 | Ji et al. | |
| 2022/0172921 A1* | 6/2022 | Den Hoedt | H01J 37/28 |

FOREIGN PATENT DOCUMENTS

| | | | | |
|---|---|---|---|---|
| WO | 2014007624 A1 | 1/2014 | | |
| WO | WO-2014007624 A1 * | 1/2014 | | G02B 21/0004 |
| WO | 2014042538 A1 | 3/2014 | | |
| WO | WO-2014112877 A1 * | 7/2014 | | G02B 21/367 |
| WO | 2015170969 A1 | 11/2015 | | |
| WO | 2016036250 A1 | 3/2016 | | |

OTHER PUBLICATIONS

Dutch Search Report from corresponding NL Application No. NL2022756, dated Dec. 3, 2019.
Ando et al., "The 2018 Correlative Microscopy Techniques Roadmap," Journal of Physics D: Applied Physics, vol. 51, Issue No. 44, Article 443001, Aug. 31, 2018, pp. 1-42.
Zonnevylle et al., "Integration of a High-NA Light Microscope in a Scanning Electron Microscope," Journal of Microscopy, vol. 252, Issue 1, Jul. 25, 2013, pp. 58-70.
Ren et al., "Transmission Electron Imaging in the Delft Multibeam Scanning Electron Microscope 1," Journal of Vacuum Science & Technology B, vol. 34, Issue No. 6, Oct. 14, 2016, 11 pages.
Okumura et al., "Electron Tomography of Whole Cultured Cells using Novel Transmission Electron Imaging Technique," Micron, vol. 104, Oct. 16, 2017, pp. 21-25.
Rigort et al., "Micromachining Tools and Correlative Approaches for Cellular Cryo-electron Tomography," Journal of Structural Biology, vol. 172, Issue 2, Feb. 21, 2010, pp. 169-179.
Sartori et al., "Correlative Microscopy: Bridging the Gap between Fluorescence Light Microscopy and Cryo-Electron Tomography," Journal of Structural Biology, vol. 160, Issue 2, Aug. 16, 2007, pp. 135-145.

* cited by examiner

INTEGRATED OPTICAL AND CHARGED PARTICLE INSPECTION APPARATUS

BACKGROUND

Field of the Invention

The invention relates to a so-called integrated inspection apparatus, featuring the integration of a charged particle exposure system and a light optical microscope. The improvement in particular relates to extension in functionality of such integrated systems, amongst other towards a new apparatus and method for studying samples.

Description of the Related Art

In recent years, powerful research means are developed for obtaining electron microscopy images and fluorescence images from the same position in the same sample, preferably simultaneously. This technology is referred to as Correlative Light and Electron Microscopy (CLEM). One way for the implementation of CLEM is an integrated system of a light optical microscope and an electron microscope. Such a system is for example described in WO2012/008836A2, WO2013/151421A2, WO2014/007624A1, WO2014/042538A1, and WO2016/036250A1.

Furthermore, high vacuum cryo-stages for the imaging of frozen specimen by CLEM have been developed. An example of such a cryo-stage is described in US2017/0271126A1. This patent application describes an optical vacuum cooling cryo-stage for correlative light and electron microscopy comprising a vacuum chamber, an anti-contamination system adapter interface, an electron microscope specimen holder adapter interface, an upper optical window, a lower optical window, a vacuum pumping system adapter interface and a vacuum valve. The anti-contamination system adapter interface is arranged in one end of the vacuum chamber. The electron microscope specimen holder adapter interface is arranged in the other end of the vacuum chamber. The upper optical window is arranged on the upper wall of the vacuum chamber, and the lower optical window is arranged on the lower wall of the vacuum chamber and opposite to the upper optical window.

A disadvantage of applying the known cryo-stage in an integrated system of a light optical microscope and an electron microscope is that they require an objective lens for the light optical microscope with a relatively large working distance, which objective lens with large working distance has a relatively small Numerical Aperture (NA), which objective lens with a small NA collects less light from the sample and makes it difficult to obtain high resolution light optical images.

In general, a cryo-stage is used when examining biological samples. Investigating biological samples at cryogenic temperatures in an electron microscope is difficult:

When using a Transmission Electron Microscope (TEM) the contrast between the various constituents of the biological sample is very low, at least when observing a sample which is not stained, which makes it difficult to obtain useful images in a regular TEM.

When using a Scanning Electron Microscope (SEM), the penetration depth of the electron beam into the sample is very limited and usually only the outer surface of the sample is imaged.

SUMMARY OF THE INVENTION

It is an object of the present invention to at least partially obviate one or more of the above identified problems and to provide at least an alternative apparatus which allows to obtain images of samples, preferably frozen samples, preferably samples which are cooled down to cryogenic temperatures.

According to a first aspect, the present invention provides an apparatus for inspecting a sample, wherein the apparatus comprises:

a sample holder for holding the sample, wherein at least the sample holder comprises a cooling system which is configured for cooling at least the sample;

a charged particle exposure system comprising an assembly for projecting a focused beam of primary charged particles onto the sample held by the sample holder; and a light optical microscope;

wherein the sample holder comprises a sheet of a scintillator material, wherein the sample holder is configured to position the sample in between the charged particle optical column and the sheet of the scintillator material, and wherein the light optical microscope comprises a first detection system configured for acquiring an image of at least a part of the sheet of the scintillator material.

In the apparatus of the present invention, the light optical microscope is used for collecting, detecting and imaging photons which are created by the focused beam of primary charged particles after transmission of said primary charged particle beam through the sample and which primary charged particles impinge on the sheet of scintillator material. Due to the scintillator material, the conversion of charged particles into photons is independent from any luminescent material in the sample.

In addition, the scintillator material can be selected to comprise a high efficiency in converting impinging charged particles into photons. Accordingly, the amount of photons emitted due to the impact of the charged particle beam that has passed through the sample is increased, and it is less difficult to obtain an image with a good signal to noise ratio, even when using an objective lens with a relatively small NA.

Furthermore, the sheet of the scintillator material is part of the sample holder and is arranged close to the sample, and the objective lens of the light optical microscope is configured to acquire an image of at least a part of the sheet of the scintillator material. In other words, the objective lens of the light optical microscope is configured to focus onto the sheet of the scintillator material.

It is noted that WO 2015/170969 A1 describes an apparatus which comprises a layer of cathodoluminescent material, wherein the layer of cathodoluminescent material is arranged close to the sample, and wherein the layer of cathodoluminescent material is arranged such that charged particles impinge on the layer of cathodoluminescent material after transmission through said sample. However, the inventor has found that such a layer of cathodoluminescent material close to a sample may heat up the sample, in particular a sample which is kept at a low or cryogenic temperature. This heat may change or even destroy the sample, in particular when the sample comprises an ultra-thin section of a biological sample. The present invention obviates this problem by configuring the sheet of the scintillator material as part of the sample holder, and configuring the cooling system to, in use, actively cool the sample holder.

In an embodiment, the cooling system is configured for cooling the sheet of the scintillator material. Although the sheet of scintillator material may be at least partially cooled due to its arrangement close to the sample which is cooled by the cooling system, it is preferred to configure the cooling system for also actively and/or directly cooling the sheet of scintillator material. It that way, the temperature of the sheet of scintillator material can be controlled and/or regulated by the cooling system, preferably in order to substantially prevent the sheet of scintillator material from heating up the sample.

In an embodiment, the sheet of the scintillator material is an integral part of the cooling system. Accordingly, the sheet of the scintillator material can assist in keeping the sample at the low temperature as it is cooled by the cooling system. In an embodiment, the cooling system is configured for cooling the sheet of scintillator material and the sample to substantially the same temperature. In addition or alternatively, the sheet of scintillator material can assist in cooling the sample.

In an embodiment, the cooling system is configured for cooling at least the sample to a temperature at or below −20° C., preferably below −30° C. Preferably, the cooling system is configured for cooling at least the sample to cryogenic temperatures, in particular to a temperature at or below −150° C., which allows to study high quality samples which are, for example, made using a Cryo-microtome. Preferably, the cooling system is configured for cooling at least the sample and the sheet of scintillator material to cryogenic temperatures. This allows to study samples under cryogenic conditions.

It is noted that the cooling system is configured for at least keeping the sample at the low temperature. Thus the cooling system does not need to be able to cool the sample down to the required low temperature. However, preferably the cooling system is configured to cool the sample and/or the sheet of scintillator material from room temperature down to the desired low temperature.

In an embodiment, the sample holder is configured to position the sample in direct contact with and/or supported by said sheet of the scintillator material. Usually for observing charged particles in transmission of a sample, the sample must be very thin, often less than 100 nm thick, and the samples are suspended on a grid. At the position where the wires of the grid are directly underneath the sample, the charged particle beam is blocked by the wires of the grid and usually no image of that area can be obtained. By arranging the sample on top of the sheet of scintillator material, a sample grid is not necessary and the complete sample is available to obtain an image therefrom. In addition, when the sample holder is configured to position the sample in direct contact, it is preferred that the cooling system is configured for cooling the sheet of the scintillator material. The sheet of the scintillator material is preferably cooled to the same temperature as the sample in order to prevent that the sample is heated by the sheet of scintillator material.

In an alternative embodiment, at least with respect to the previous embodiment, the sample holder is configured to position the sample spaced apart from said sheet of the scintillator material. For example, in order to provide a cryostage according to the present invention, the lower optical window of the optical vacuum cooling cryostage of US 2017/0271126 A1 is replaced by an optical window comprising said sheet of the scintillator material, and the light optical microscope, preferably the objective lens thereof, must be configured for acquiring an image of at least a part of the optical window with the sheet of the scintillator material. By positioning the sample at a distance from the sheet of scintillator material, it becomes more easy to separate between fluorescence originating from the sample and fluorescence originating from the sheet of scintillator material, for example by changing the focus position from the sample to the sheet of scintillator material or vice versa.

In an embodiment, the sheet of the scintillator material comprises a surface which faces an objective lens of the light optical microscope, wherein said surface curved surface part, preferably a convex curved surface part. In an embodiment, the sheet of the scintillator material is arranged on top of a carrier which is at least partially transparent, wherein the carrier comprises a surface which faces an objective lens of the light optical microscope, wherein said surface comprises a curved surface part, preferably a convex curved surface part. Accordingly, the curved part of the sheet of scintillator material or the curved part of the carrier acts as a solid immersion lens. The curved surface part in combination with the objective lens of the light microscope provides an optical system with a higher Numerical Aperture (NA) when compared with an optical system without the curved surface, and more light from the sheet of scintillator material can be collected by the light optical microscope. Accordingly, more faint emissions of photons from charged particles which impinge on the sheet of cathodoluminescent material after transmission through said sample can be studied.

In an embodiment, the charged particle exposure system comprises a charged particle microscope, preferably an electron microscope, more preferably a scanning electron microscope. This scanning electron microscope is used in transmission and the sheet of scintillator material of the sample holder, together with the light optical microscope, acts as detector for the scanning electron microscope.

In an alternative embodiment, the charged particle exposure system comprises a Focused Ion Beam system for directing a focused ion beam to a position on the sample holder where in use the sample is arranged. In an embodiment wherein said position is arranged to be observable by the light optical microscope. Accordingly, the sample can be modified or machined by the focused ion beam and the modified or machined parts of the sample can be studied using the light optical microscope. In addition, when ions from the focused ion beam traverse through the sample and impinge on the sheet of scintillator material, they can create photons which can be used to obtain an ion particle transmission image.

In an embodiment, the apparatus further comprises a Focused Ion Beam system for directing a focused ion beam to a position on the sample holder where in use the sample is arranged. The apparatus according to this embodiment comprises both a charged particle exposure beam and a focused ion beam. Preferably, the charged particle exposure beam comprises a charged particle microscope, preferably an electron microscope, more preferably a scanning electron microscope. Accordingly, the sample can be modified or machined by the focused ion beam and the modified or machined parts of the sample can be studied using the charged particle microscope. Accordingly, the present embodiment allows to modify or machine the sample using a FIB and observing the modified or machined parts by the primary charged particle beam in the same apparatus. In an embodiment, said position is arranged to be observable by the light optical microscope and/or the charged particle exposure system. Accordingly, the sample can be modified or machined by the focused ion beam and the modified or machined parts of the sample can be studied using the light optical microscope, but also using photons which are created by the focused beam of primary charged particles from the charged particle exposure beam after transmission of said primary charged particle beam through the sample and which primary charged particles impinge on the sheet of scintillator material. Accordingly, the present embodiment allows to modify or machine the sample using a FIB and observing the modified or machined parts by the primary charged particle beam in the same apparatus.

In an embodiment, the apparatus further comprises a Plasma system for directing a plasma to a position on the sample holder where in use the sample is arranged. In an embodiment said position is arranged to be observable by the light optical microscope.

In an embodiment, the sample holder is configured for positioning the sample in between the charged particle exposure system and the light optical microscope. Although the light produced by the scintillator material may be observed through the sample, in particular when using thin samples of 100 nm thick or even thinner, it is preferred to position the light optical microscope at a side of the sheet of scintillator material which faces away from the sample position. Accordingly, the light optical microscope can have a substantially clear and un-obstructed view of the sheet of scintillator material.

In an embodiment, the sheet of the scintillator material or a carrier carrying the sheet of scintillator material comprises a surface which faces an objective lens of the light optical microscope, wherein said surface comprises a curved surface, preferably a convex surface. Accordingly, the sheet of scintillator material or a carrier carrying the sheet of scintillator material can act as a solid immersion lens. Accordingly, this embodiment allows to collect more light from the sheet of scintillator material and thus to study also faint emissions of photons from charged particles which impinge on the sheet of cathodoluminescent material after transmission through said sample. In addition, this embodiment may also provide an enhanced spatial resolution of the light optical microscope.

In an embodiment, the sheet of scintillator material is at least substantially transparent, preferably the sheet of scintillator material is substantially transparent for light in a wavelength range in the visual spectrum. Accordingly, the sample can be observed by the light optical microscope through the sheet of scintillator material. This allows to study, position and select an area of the sample using the light optical microscope before using the charged particle exposure system for creating a high resolution image of said area. Accordingly, the dose of charged particles on the sample can be minimized, which is advantageous for studying delicate samples which may be damaged by an exposure by charged particles.

In an embodiment, the cooling system comprises a Joule-Thomson cooler, a thermoelectric cooler, a pulse tube cooler, a cryostat and/or a Dewar.

In an embodiment, the cooling system comprises a micro-cooling device comprising:
a substantially completely enclosed cooling chamber comprising an input opening and an output opening, wherein the output opening is spaced apart from the input opening,
a feed channel connected to the input opening of the cooling chamber, wherein the feed channel is configured for feeding a cooling medium to the cooling chamber,
a discharge channel connected to the output opening of the cooling chamber, wherein the discharged channel is configured for discharging cooling medium from the cooling chamber,
wherein the sheet of a scintillator material is arranged in heat exchanging contact with the cooling chamber, preferably wherein the sheet of a scintillator material is at least part of a wall of the cooling chamber. In use, the sheet of scintillator material is cooled by the cooling medium.

In an embodiment, the cooling chamber comprises an evaporation chamber, wherein the cooling system comprises a restriction arranged in the feed channel adjacent to the input opening of the evaporation chamber and/or arranged at least partially in the input opening of the evaporation chamber, and wherein the feed channel is configured for feeding a high pressure cooling medium. Such a cooling device is, for example, described in US 2013/0248167 A1 which is incorporated herein by reference.

According to a second aspect, the invention provides a cryostage for scanning charged particle microscopy, wherein the cryostage comprises:
a sample holder for holding the sample,
a cooling system which is configured for cooling at least the sample; and
a sheet of a scintillator material, wherein the sample holder is configured to position the sample in front of the sheet of scintillator material. Accordingly, when arranged in a scanning charged particle microscope, the charged particle beam of the scanning charged particle microscope may impinge on the sheet of scintillator material after transmission through the sample.

In an embodiment, the sheet of scintillator material is arranged in heat exchanging contact with the cooling system. In use, the sheet of scintillator material is cooled by the cooling system.

In an embodiment, the cooling system comprising:
a substantially completely enclosed cooling chamber comprising an input opening and an output opening, wherein the output opening is spaced apart from the input opening,
a feed channel connected to the input opening of the cooling chamber, wherein the feed channel is configured for feeding a cooling medium to the cooling chamber,
a discharge channel connected to the output opening of the cooling chamber, wherein the discharged channel is configured for discharging cooling medium from the cooling chamber,
wherein the sheet of a scintillator material is arranged in heat exchanging contact with the cooling chamber.

In an embodiment, the sheet of a scintillator material is at least part of wall of the cooling chamber.

In an embodiment, the cooling chamber comprises an evaporation chamber, wherein the cooling system comprises a restriction arranged in the feed channel adjacent to the input opening of the evaporation chamber and/or arranged at least partially in the input opening of the evaporation chamber, and wherein the feed channel is configured for feeding a high pressure cooling medium.

In an embodiment, the sheet of scintillator material comprises Yttrium Aluminum Garnet (YAG, $Y_3AL_5O_{12}$), which is a synthetic crystalline material of the garnet group, or Yttrium Aluminum Perovskite (YAP, $YAlO_3$:Ce), or Organic scintillators.

According to a third aspect, the present invention provides a method for inspecting a sample using an apparatus comprising:
a sample holder for holding the sample, wherein at least the sample holder comprises a cooling system which is configured for cooling at least the sample;
a charged particle exposure system comprising an assembly for projecting a focused beam of primary charged particles onto the sample held by the sample holder; and
a light optical microscope;
wherein the sample holder comprises a sheet of a scintillator material, wherein the sample holder is configured to position the sample in between the charged particle optical column and the sheet of the scintillator material,
wherein the light optical microscope comprises a first detection system configured for acquiring an image of at least a part of the sheet of the scintillator material, and
wherein the method comprises the steps of:
providing a cooled sample on the sample holder; and
using the light optical microscope to detect photons which are created by the focused beam of primary charged particles after transmission of said primary charged particle beam through the sample and which primary charge particles impinge on the sheet of scintillator material.

In an embodiment, the method comprises the step of: cooling the sample in the sample holder by means of the cooling system of the sample holder, preferably cooling the sample to cryogenic temperatures.

In an embodiment, the method comprises the step of: cooling the sheet of a scintillator material by means of the cooling system of the sample holder, preferably cooling the sheet of a scintillator material to cryogenic temperatures.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1A:
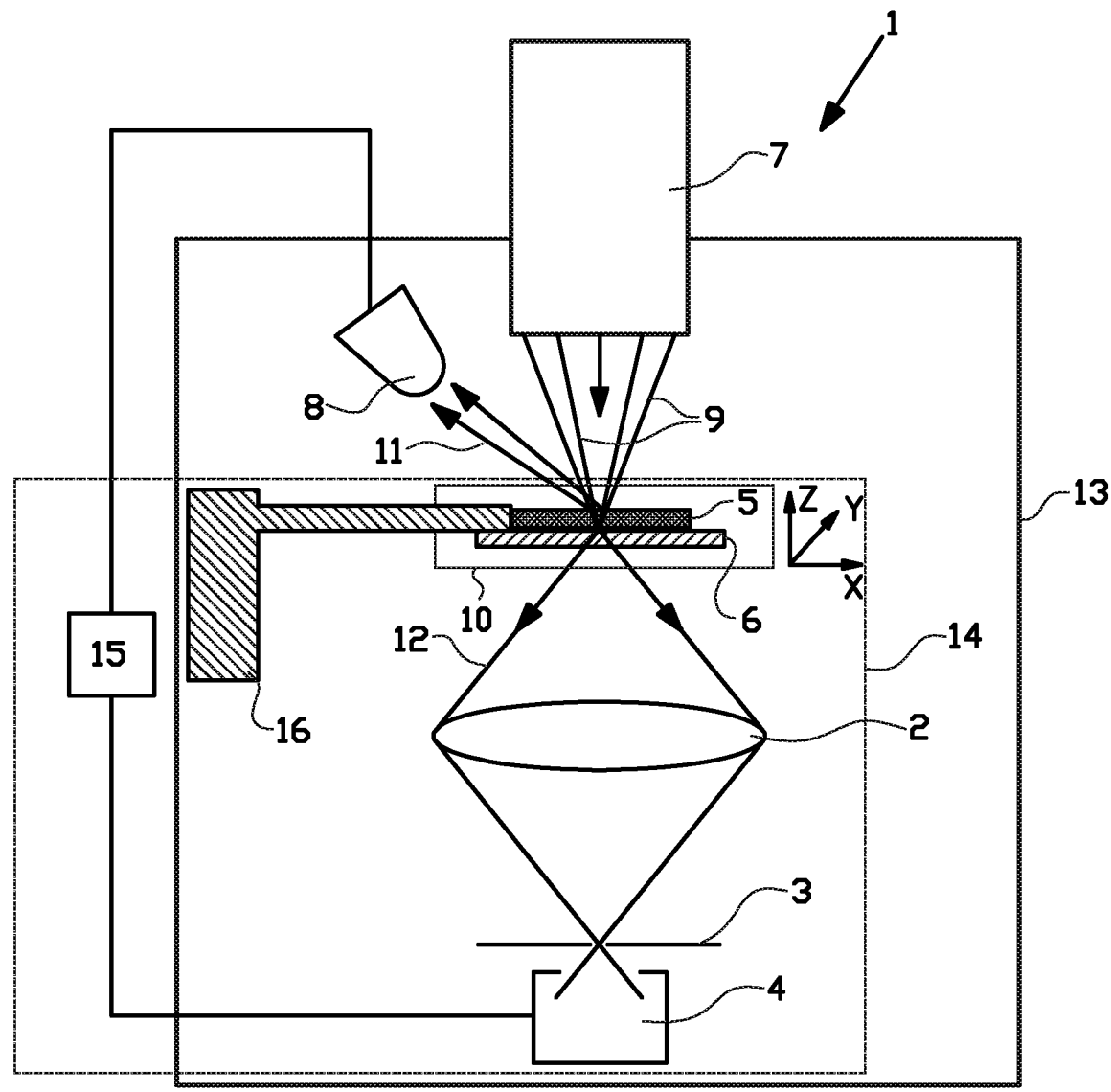
FIG. 1A schematically shows a first exemplary embodiment of an apparatus as typically improved by the present invention.

FIG. 1A schematically shows a first exemplary embodiment of an apparatus as typically improved by the present invention. The apparatus comprises in combination at least a light optical microscope 2, 3, 4 and a charged particle microscope 7,8, such as an ion- or electron microscope.

The charged particle microscope 7, 8 comprises a source 7 for emitting a primary charged particle beam 9 of charged particles and directing said primary beam to a sample 5 supported by a substrate included in a sample holder 10. The apparatus comprises a detector 8 for detection of secondary charged particles 11 backscattered from the sample 10, or emitted, transmitted, or scattered from the sample 10 and induced by the primary charged particle beam 9. The charged particle microscope 7,8 is substantially arranged inside a vacuum chamber 13.

The light optical microscope 2, 3, 4 is equipped with a light collecting device 2, usually referred to as an objective lens, to receive in use light 12 from the sheet of scintillator material 6, which light 12 is induced by the primary charged particle beam 9 after transmission of this primary charged particle beam 9 through the sample 5. The light optical microscope is configure to focus the light 12 on a photon detector 4, such as a known per se CCD camera. In the present example the optical microscope 2, 3, 4 is of a confocal type having a pinhole 3 between the light collecting device 2 and the photon detector 4. The optical microscope 2, 3, 4 is placed entirely inside the vacuum chamber 13 of the charged particle microscope 7, 8.

The inspection apparatus 1 comprises a sample holder 10 for holding the sample 5. The sample holder 10 comprises a cooling system 16 which is configured for cooling the sample 5. Cooling systems as such are known in the art, for example from US 2017/0271126 A1, and may comprise a liquid nitrogen chamber or Dewar (not shown) which in use is filled with liquid nitrogen, and a heat conductive rod (not shown) which extends substantially from inside the liquid nitrogen chamber towards the to be cooled sample 5, wherein in use the heat conductive rod extends to within the liquid nitrogen in the liquid nitrogen chamber. However, other cooling systems can also be applied, in particular one of the cooling systems as described below, with reference to FIGS. 5 and 6.

In addition, the sample holder 10 comprises a sheet of a scintillator material 6, for example comprising a layer of Yttrium Aluminum Garnet (YAG, $Y_3AL_5O_{12}$). The sample holder 10 is configured to position the sample 5 in between the source 7 of the charged particle microscope 7,8 and the sheet of the scintillator material 6. The light optical microscope 2, 3, 4 is arranged at a side of the sheet of scintillator material 6 facing away from the sample 5.

The closed dashed line 14 encircles those parts of the inspection apparatus 1 of the invention that may all or some of them be mounted on a (replaceable) door of the vacuum chamber 13. In particular, the sample holder for the sample 10, the light collecting device 2, the optional pinhole 3, and the photon-detector 4, are preferably mounted on said door of the vacuum chamber 13. This particular construction enables an easy retrofit or completion of an existing charged particle microscope according to prior art in order to convert it into an inspection apparatus according of the integrated type as is subject to the present invention.

In FIG. 1A, a processing unit 15, alternatively denoted controller, is provided and useable as an automation unit, e.g. in the form of a computer, including a personal computer provided with dedicated software, implementing one or more methods of use of the inspection apparatus.

As schematically indicated in FIG. 1A, the sample holder comprises a stage for moving the sample 5 with respect to the light optical microscope 2, 3, 4 and/or a charged particle microscope 7,8. Preferably the stage is configured for providing six degrees of freedom for moving the sample 5; thus providing translational movement along the X, Y and Z axis and rotational movement around the X, Y and Z axis. In particular, the stage is configured for rotating the sample 5 around a rotation axis which extends in a direction substantially perpendicular to an center axis of the charged particle exposure system and/or substantially perpendicular to an optical axis of an objective lens of the light optical microscope; in this example around a rotation axis which extends in a direction substantially perpendicular to the Z-axis. By obtaining images of the sample at various angles around this rotation axis, three dimensional information can be obtained from the sample 5. In some cases, even a three dimensional image of the sample 5 can be reconstructed.

Figure 1B:
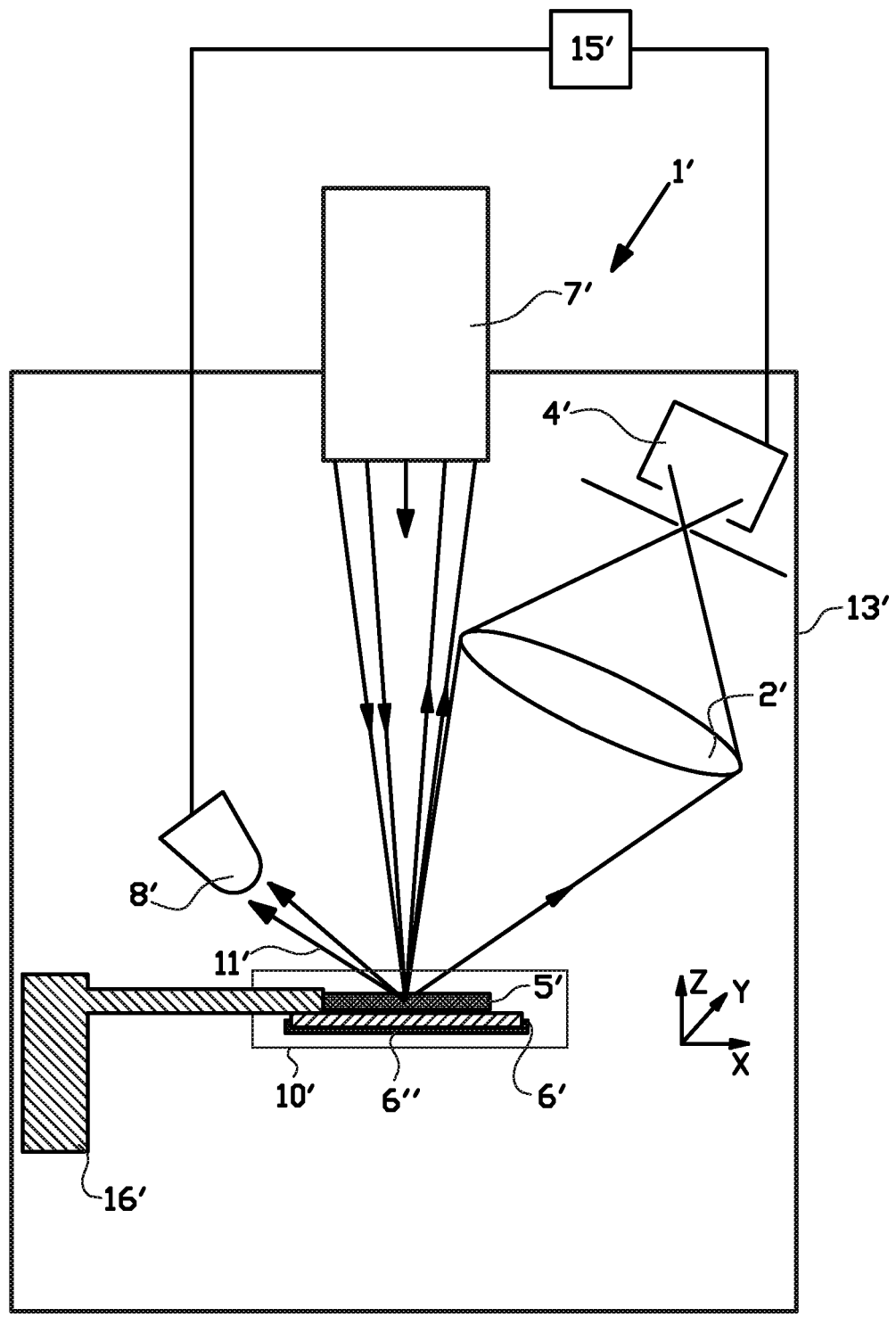
FIG. 1B schematically shows a second exemplary embodiment of an apparatus as typically improved by the present invention FIG. 2 schematically shows a third exemplary embodiment of an apparatus as typically improved by the present invention.

FIG. 1B schematically shows a second exemplary embodiment of an apparatus as typically improved by the present invention. Again, the apparatus 1' comprises in combination at least a light optical microscope 2', 4' and a charged particle microscope 7',8', such as an ion- or electron microscope. The light optical microscope 2', 4' is arranged at the same side of the sample 5' as the charged particle microscope 7',8'.

The charged particle microscope 7', 8' comprises a source 7' for emitting a primary charged particle beam 9' of charged particles and directing said primary beam to a sample 5' supported by a substrate included in a sample holder 10'. The apparatus comprises a detector 8' for detection of secondary charged particles 11' induced by the primary charged particle beam 9' impinging on the sample 5'. The charged particle microscope 7',8' is substantially arranged inside a vacuum chamber 13'.

The light optical microscope 2', 4' is equipped with a light collecting device 2', usually referred to as an objective lens, to receive in use light 12' from the sheet of scintillator material 6', which light 12' is induced by the primary charged particles from the primary charged particle beam 9' after transmission of these primary charged particles through the sample 5'. In order to allow charged particles to traverse the sample 5', the sample 5' is a thin sample as for example used in a Transmission Electron Microscope. In such a thin sample 5', the electroluminescence light generated by the primary charged particles which traverse the sample and impinge on the sheet of scintillator material 6', can also be observed through the sample 5' using for example the set-up of FIG. 1B.

As schematically shown in FIG. 1B, the light optical microscope 2', 4' is configure to collect the light 12' from the sheet of scintillator material 6' through the sample 5' and to direct this light 12' on a photon detector 4', such as a known per se CCD camera.

In order to increase the amount of collected light 12' from the sheet of scintillator material 6', the sheet of scintillator material 6' may be provided with a light reflecting coating 6" at a side of the sheet of scintillator material 6' facing away from the sample 5'.

In FIG. 1B, a processing unit 15', alternatively denoted controller, is provided and useable as an automation unit, e.g. in the form of a computer, including a personal computer provided with dedicated software, implementing one or more methods of use of the inspection apparatus.

The sample holder 10' comprises a cooling system 16' which is configured for cooling the sample 5'. As schematically indicated in FIG. 1B, the sample holder 10' comprises a stage for moving the sample 5' with respect to the light optical microscope 2', 4' and/or a charged particle microscope 7', 8'. Preferably the stage is configured for providing six degrees of freedom for moving the sample 5'; thus providing translational movement along the X, Y and Z axis and rotational movement around the X, Y and Z axis.

Figure 2:
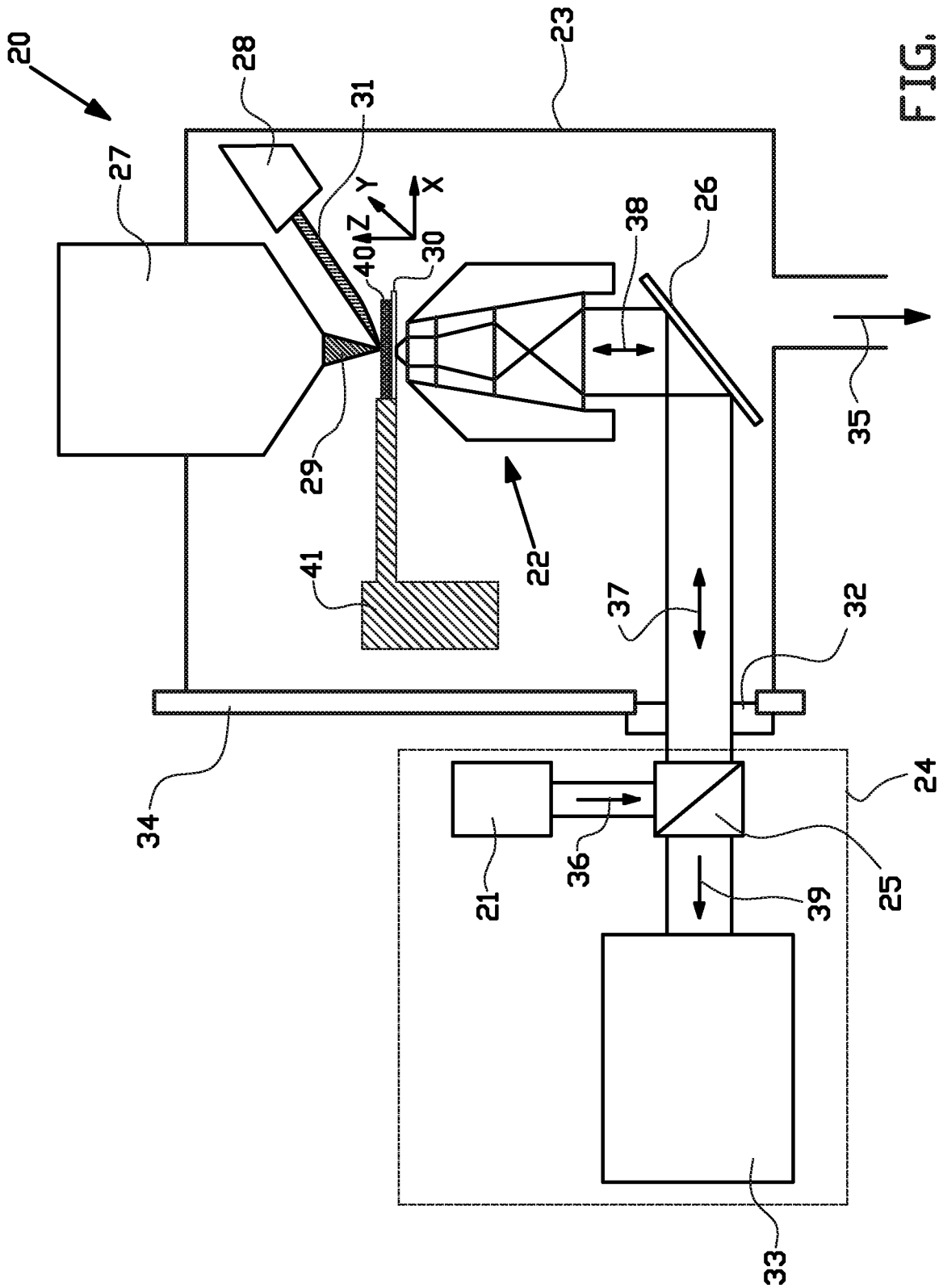

FIG. 2 schematically shows a third exemplary embodiment of an apparatus as typically improved by the present invention. The apparatus 20 of FIG. 2 comprises a Scanning Electron Microscope (SEM) 27 comprising a vacuum chamber 23 which is connected to a vacuum pump via a connector 35. Inside said vacuum chamber 23, a sample 40 is arranged, which sample 40 can be irradiated with an electron beam 29. The apparatus 20 comprises a detector 28 for detection of secondary charged particles 31 backscattered from the sample 40, or emitted from the sample 40 as a result of the primary charged particle beam 29 impinging on the sample 40.

As schematically shown, the sample 40 is arranged on top of as sheet of scintillating material 30 which acts as a holder for holding the sample 40. The sample holder comprises a cooling system 41 which is configured for cooling the sample 40 and the sheet of scintillating material 30. Again, cooling systems as such are known in the art, for example from US 2017/0271126 A1, and may comprise a liquid nitrogen chamber or Dewar (not shown) which in use is filled with liquid nitrogen, and a heat conductive rod (not shown) which extends substantially from inside the liquid nitrogen chamber towards the to be cooled sample 40, wherein in use the heat conductive rod extends to within the liquid nitrogen in the liquid nitrogen chamber. However, other cooling systems can also be applied, in particular one of the cooling systems as described below, with reference to FIGS. 5 and 6.

The sheet of scintillator material 30, for example comprising a thin slab of Yttrium Aluminum Garnet (YAG, $Y_3AL_5O_{12}$). The sample holder is configured to position the sample 40 in between the SEM 27 and the sheet of the scintillator material 30.

Below the sheet of scintillating material 30 a microscope objective 22 is arranged inside the vacuum chamber 23, which is part of the light optical microscope system. In this particular example, the other major parts of the light optical microscope system are arranged outside the vacuum chamber 23 in an illumination and detection box 24.

The illumination and detection box 24 may comprise a light source 21, for example a LED of a Laser. The emitted light 36 from het light source 21 is directed out of the illumination and detection box 24 via a half transparent mirror or dichroic 25 and is directed into the vacuum chamber 23 via a window 32. This light 37, 38 is coupled into the microscope objective 22 via a mirror 26, for illuminating the sample 40. Although the illumination arrangement can be used for illuminating the sample with light and to study the sample under illumination by light, the illumination arrangement is not necessary to obtain an image using the transmitted electrons through the sample 40 which are converted into light by the sheet of scintillating material 30.

Light 37, 38 from the sample 40 is collected by the microscope objective 22 and is directed via the mirror 26 and the window 32 towards the illumination and detection box 24, and is imaged 39 via the half transparent mirror or dichroic 25 onto a camera 33, for example a CCD detector.

As shown in FIG. 2, the light beams for illuminating and/or imaging the sample 40 enter into and passed from the vacuum chamber 23 via a window 32 which in this example is arranged in a door 34 of said vacuum chamber 23. The illumination and detection box 24 of the light optical microscope system is arranged outside vacuum chamber 23 and may be attached to the outside of the door 34. However, the illumination and detection part of the light optical microscope system may as well be included fully inside, e.g. attached to a bottom part, of the vacuum chamber 23.

Clearly, the illumination and detection box 24 may be configured in other manners and may comprise any kind of microscope, including e.g. cathodoluminescence microscope, laser confocal scanning microscope and wide field microscope. In addition, the camera 33 can be replace by another type of detector, such as a photodiode or a photomultiplier which measures the light intensity originating from a spot in the image. When using such as spot measuring detector to measure the light intensity from various spots on the sample 40 by scanning over the sample 40, the combination of such point to point measurements can also provide an image of the sample 40.

In this exemplary embodiment, it is advantageous to select a sheet of scintillator material 30 which is at least substantially transparent, preferably wherein the sheet of scintillator material is substantially transparent for light in a wavelength range in the visual spectrum. Accordingly, the sample 40 can be observed by means of the light optical microscope through the sheet of scintillator material 30.

As schematically indicated in FIG. 2, the sample holder comprises a stage for moving the sample 40 for providing six degrees of freedom in movement of the sample 40; thus providing translational movement along the X, Y and Z axis and rotational movement around the X, Y and Z axis.

Figure 3:
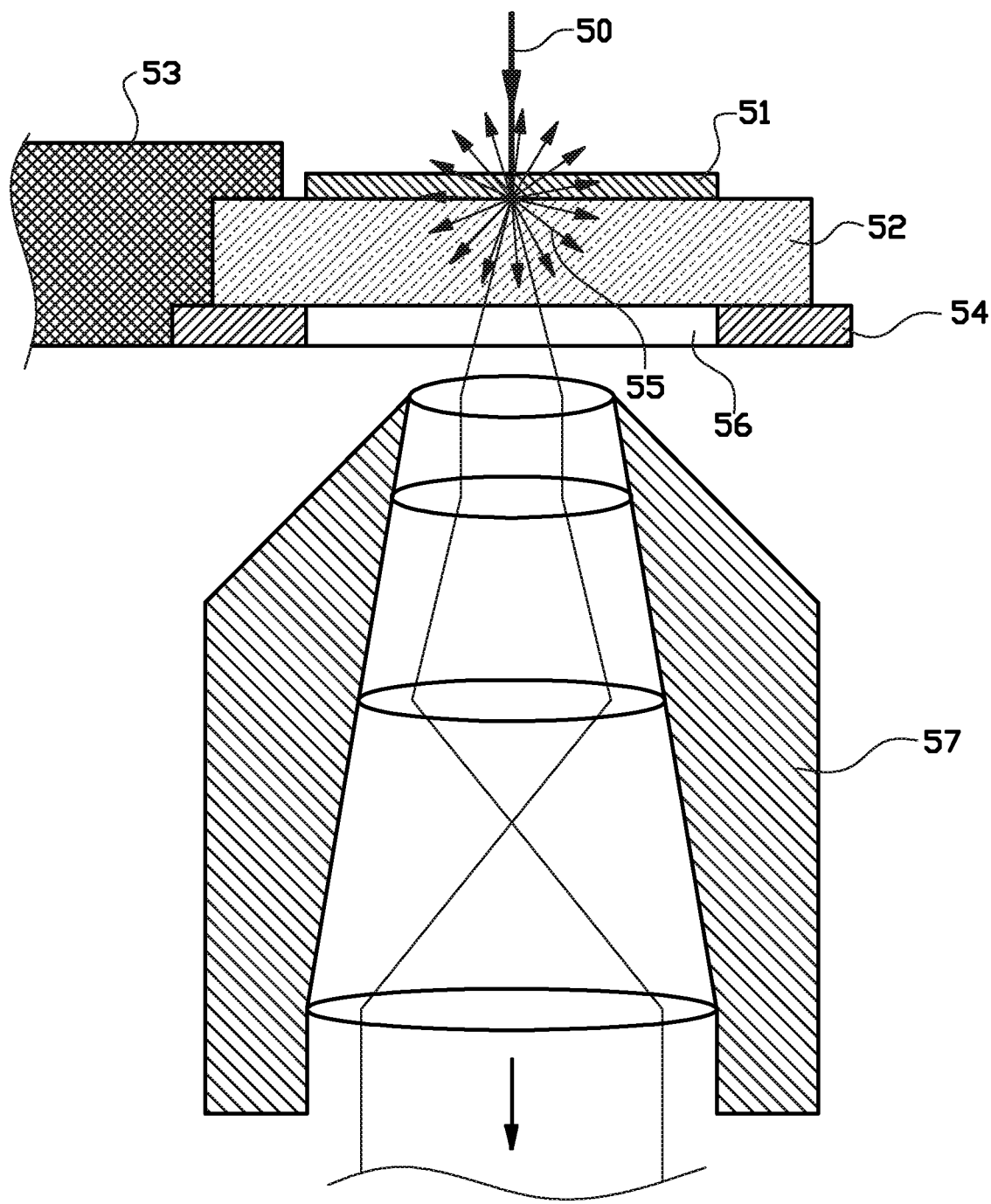
FIG. 3 schematically shows an example of a first embodiment of part of the sample holder as improved by the present invention.

FIG. 3 schematically shows an example of a first embodiment of part of the sample holder as improved by the present invention. The sample holder comprises a support member 54 with a slab of scintillator material 52 on top. The support member 54 is provided with a through opening 56 to provide a window for observing the sample 51 via the through opening 56 and through the scintillator material 52. The support member 54 is made from heat conductive material and is connected to the cooling system 53. The sheet of scintillator material 52 is connected to the support member 54 and to the cooling system 53. Accordingly, the support member 54 and the sheet of scintillator material 52 can be cooled down, preferably to cryogenic temperatures.

As schematically shown in FIG. 3, the cooled sample 51 is arranged on top of the sheet of scintillator material 52. When a primary charged particle beam 50 impinges onto the sample 51, part of that primary charged particle beam 50 may by transmitted through the sample 51 and this transmitted part impinges on the sheet of scintillator material 52, where the transmitted primary charged particles are at least partially converted into photons 55. A part of these photons travel through the sheet of scintillating material 52 and through the through opening 56 of the support member 54, and can be collected by the microscope objective 57.

Figure 4:
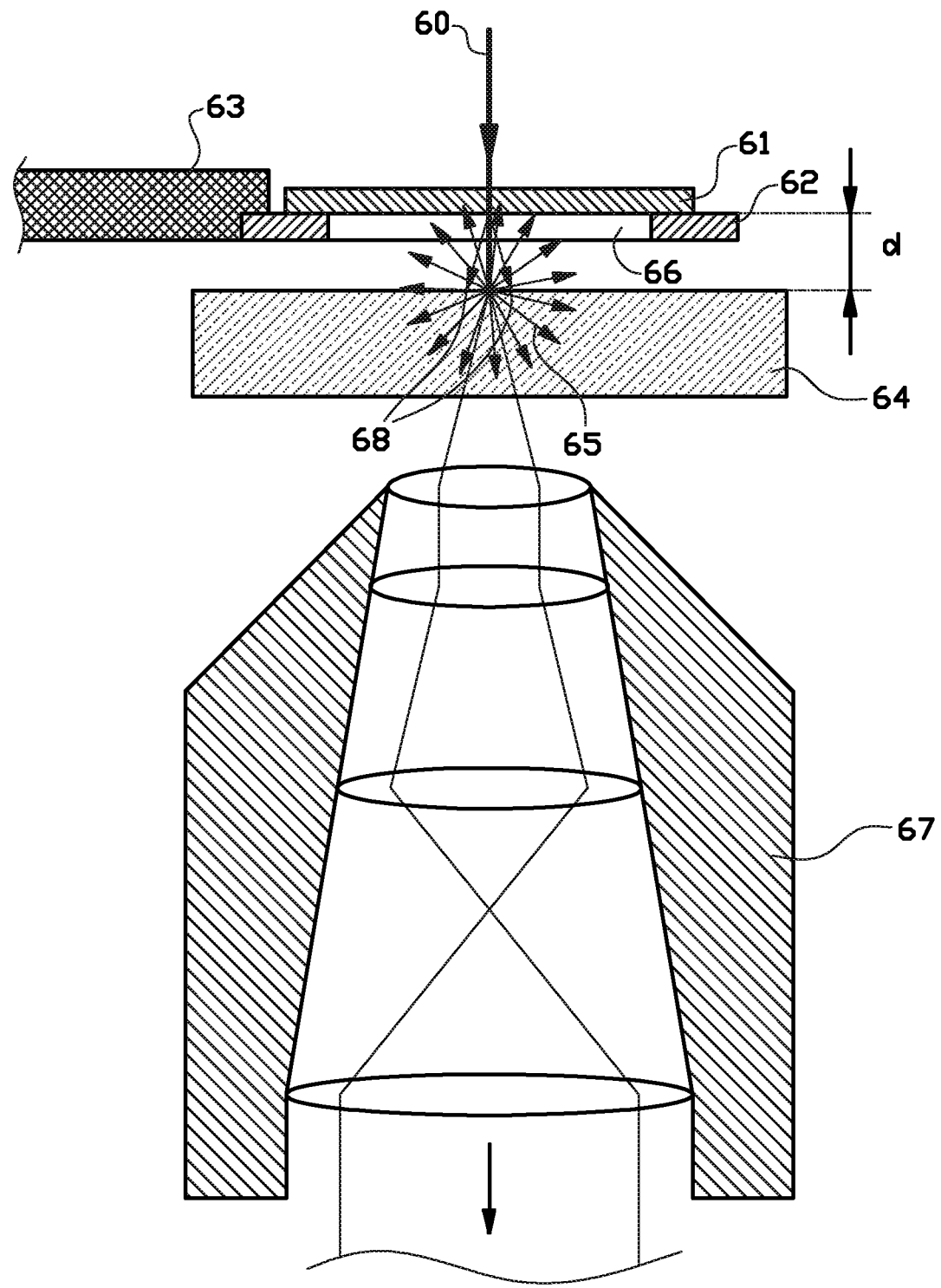
FIG. 4 schematically shows an example of a second embodiment of part of the sample holder as improved by the present invention.

FIG. 4 schematically shows an example of a second embodiment of part of the sample holder as improved by the present invention. The sample holder comprises a support member 62 which is arranged for supporting a sample 61 which may suitably be provided and supported on top of a TEM sample support mesh grid (not shown). The support member 62 is provided with a through opening 66 to provide a window for observing the sample 61 via the through opening 66. The support member 62 is made from heat conductive material and is connected to the cooling system 63. Accordingly, the support member 62 can be cooled down, preferably to cryogenic temperatures.

In this exemplary embodiment, the sheet of scintillator material 64 is arranged spaced apart from the support member 62 and the sample 61.

As schematically shown in FIG. 4, the cooled sample 61 is arranged on top of the support member 62. When a primary charged particle beam 60 impinges onto the sample 61, part of that primary charged particle beam 60 may by transmitted through the sample 61 and this transmitted part impinges on the sheet of scintillator material 64, where the transmitted primary charged particles are at least partially converted into photons 65. A part of these photons travel through the sheet of scintillating material 64, and can be collected by the microscope objective 67.

However, part of the charged particle beam 50 which is transmitted through the sample 61 may also be scattered in the sample 61, which results in diverted beams 68 around the central primary charged particle beam 50. Also these scattered beams 68 impinge on the sheet of scintillator material 64 and are at least partially converted into photons, which can be collected by the microscope objective 67 and imaged by the light optical microscope, for example for generating a dark field image.

Figure 5:
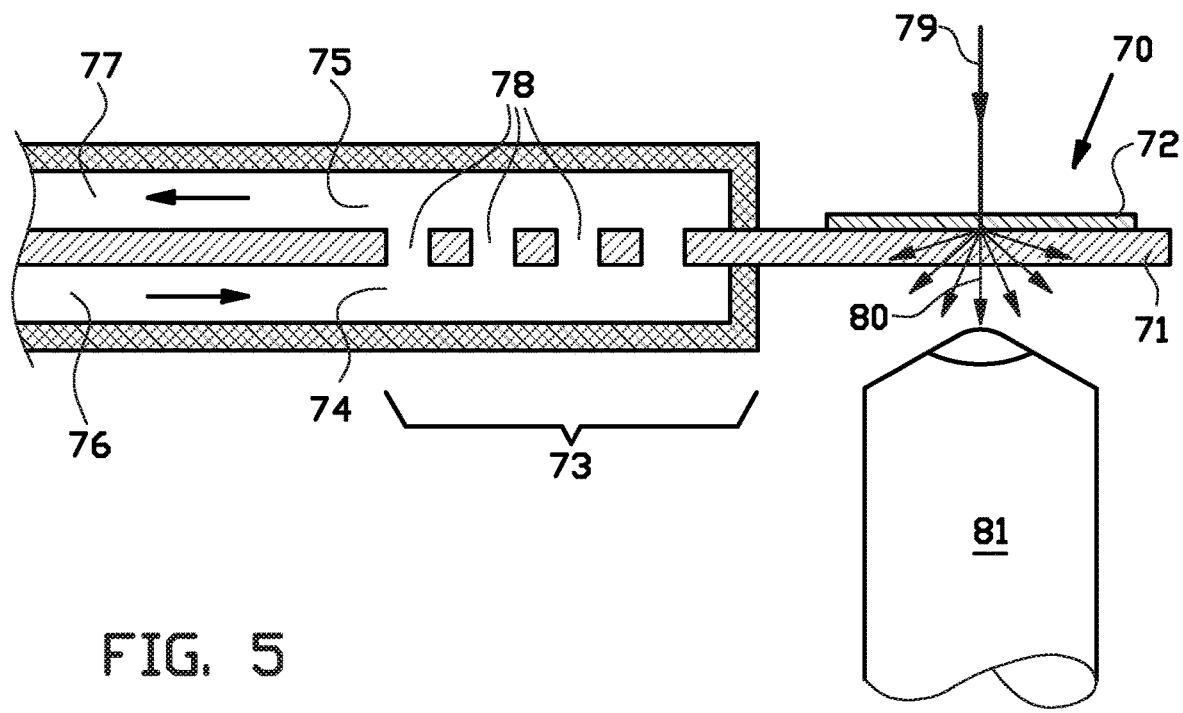
FIG. 5 schematically shows an example of a third embodiment of part of the sample holder as improved by the present invention.

FIG. 5 schematically shows an example of a third embodiment of part of the sample holder as improved by the present invention, wherein the sample holder is configured for circulating a cooling fluid close to the sample position. As shown in FIG. 5, the sample holder 70 comprises a support member 71 for holding a sample 72. The support member 71 comprises a sheet of scintillating material, and extends into a cooling chamber 73. The cooling chamber 73 is substantially completely enclosed and comprises an input opening 74 and an output opening 75, wherein the output opening 75 is spaced apart from the input opening 74. The sample holder further comprises a feed channel 76 connected to the input opening 74 of the cooling chamber 73, wherein the feed channel 76 is configured for feeding a cooling fluid to the cooling chamber 73. The sample holder also comprises a discharge channel 77 connected to the output opening 75 of the cooling chamber 73, wherein the discharged channel 77 is configured for discharging cooling fluid from the cooling chamber 73. As schematically indicated in FIG. 5, the support member 71 which comprises the sheet of a scintillator material extends into the cooling chamber 73, and is provided with through openings 78 for allowing the cooling fluid to flow from the input opening 74 to the output opening 75. In the cooling chamber 73, the cooling fluid can come in direct contact with the support member 71 and/or sheet of scintillator material. Accordingly, in use, the sheet of scintillator material is arranged in heat exchanging contact with the cooling chamber and the cooling fluid therein. The support member 71, comprises said sheet of a scintillator material, is at least part of a wall of the cooling chamber 73; in this embodiment a partition wall with through openings 78 inside the cooling chamber 73.

It is noted that in the example shown in FIG. 5, the support member 71 is made of the scintillator material, and the sheet of scintillator material forms the support member 71. Alternatively, the support member 71 may comprise a thin layer of scintillator material arranged on top of a light transmitting support plate, which light transmitting support plate may comprise a glass plate.

As schematically shown in FIG. 5, the cooled sample 72 is arranged on top of the support member 71. When a primary charged particle beam 79 impinges onto the sample 72, part of that primary charged particle beam 79 may by transmitted through the sample 72 and this transmitted part impinges on the support member 71 with the scintillator material, where the transmitted primary charged particles are at least partially converted into photons 80. A part of these photons 80 travel through the support member 71, and can be collected by the microscope objective 81.

It is noted that the cooling fluid used for cooling the support member 71 and the sample 72 may comprise a cold liquid, such as liquid Nitrogen, or a cold gas, such as cold Helium gas.

Figure 6:
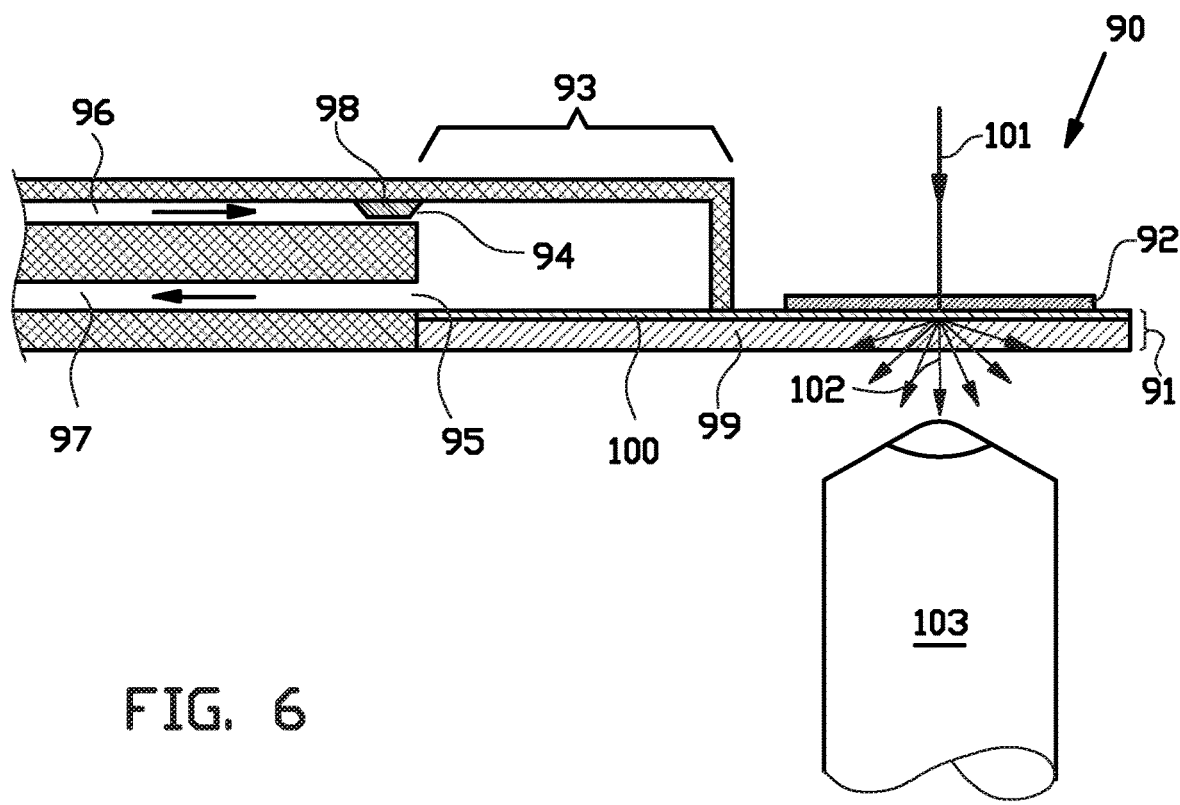
FIG. 6 schematically shows an example of a fourth embodiment of part of the sample holder as improved by the present invention, FIG. 7 schematically shows an example of a fifth embodiment of part of the sample holder as improved by the present invention, FIG. 8 schematically shows an example of a sixth embodiment of part of the sample holder as improved by the present invention, FIG. 9A schematically shows an example of an embodiment combined with a Focused Ion Beam system for modifying or machining a sample, FIG. 9B schematically shows setup of FIG. 9A for studying the modified or machined sample using the beam of primary charged particles.

FIG. 6 schematically shows an example of a fourth embodiment of part of the sample holder as improved by the present invention, wherein the sample holder is configured for providing a cooling effect using the Joule-Thomson cycle close to the sample position. As shown in FIG. 6, the sample holder 90 comprises a support member 91 for holding a sample 92. The support member 91 comprises a sheet of scintillating material, and extends into a cooling chamber 93, in particular into a wall of the cooling chamber 93. The cooling chamber 93 is substantially completely enclosed and comprises an input opening 94 and an output opening 95, wherein the output opening 95 is spaced apart from the input opening 94. The sample holder further comprises a feed channel 96 connected to the input opening 94 of the cooling chamber 93. Adjacent to the input opening 94 of the cooling chamber 93 and/or arranged at least partially in the input opening 94 of the cooling chamber 93, a restriction 98 is arranged in the feed channel 96.

In use, a cooling medium such a Nitrogen gas, is provided at a high pressure to the restriction 98. The restriction 98 will cause a pressure drop, resulting in a temperature drop and a phase change of the cooling medium. The liquid cooling medium evaporates inside the cooling chamber 93 and cools the cooling chamber 93 to the low temperature. The evaporated cooling medium is discharged from the cooling chamber 93 a discharge channel 97 connected to the output opening 95 of the cooling chamber 93. As schematically indicated in FIG. 6, the support member 91 which comprises the sheet of a scintillator material extends to form a wall of the cooling chamber 93. In the cooling chamber 93, the cooling medium can come in direct contact with the support member 91 and/or sheet of scintillator material. Accordingly, in use, the sheet of scintillator material is arranged in heat exchanging contact with the cooling chamber 93 and the cooling medium therein.

It is noted that in the example shown in FIG. 6, the support member 91 comprises a thin layer of scintillator material 100 arranged on top of a light transmitting support plate 99, which light transmitting support plate may comprise a glass plate. Alternatively, the support member 91 may be made of the scintillator material, and the sheet of scintillator material forms the support member 91.

As schematically shown in FIG. 6, the cooled sample 92 is arranged on top of the support member 91. When a primary charged particle beams 101 impinges onto the sample 92, part of that primary charged particle beam 101 may by transmitted through the sample 92 and this transmitted part impinges on the support member 91 with the scintillator material 100, where the transmitted primary charged particles are at least partially converted into photons 102. A part of these photons 102 travel through the support member light transmitting support plate 99, and can be collected by the microscope objective 103.

It is noted that in this example, the low temperatures are generated in the sample holder 90, in particular close to the sample 92 and/or the sheet of scintillator material 100.

Figure 7:
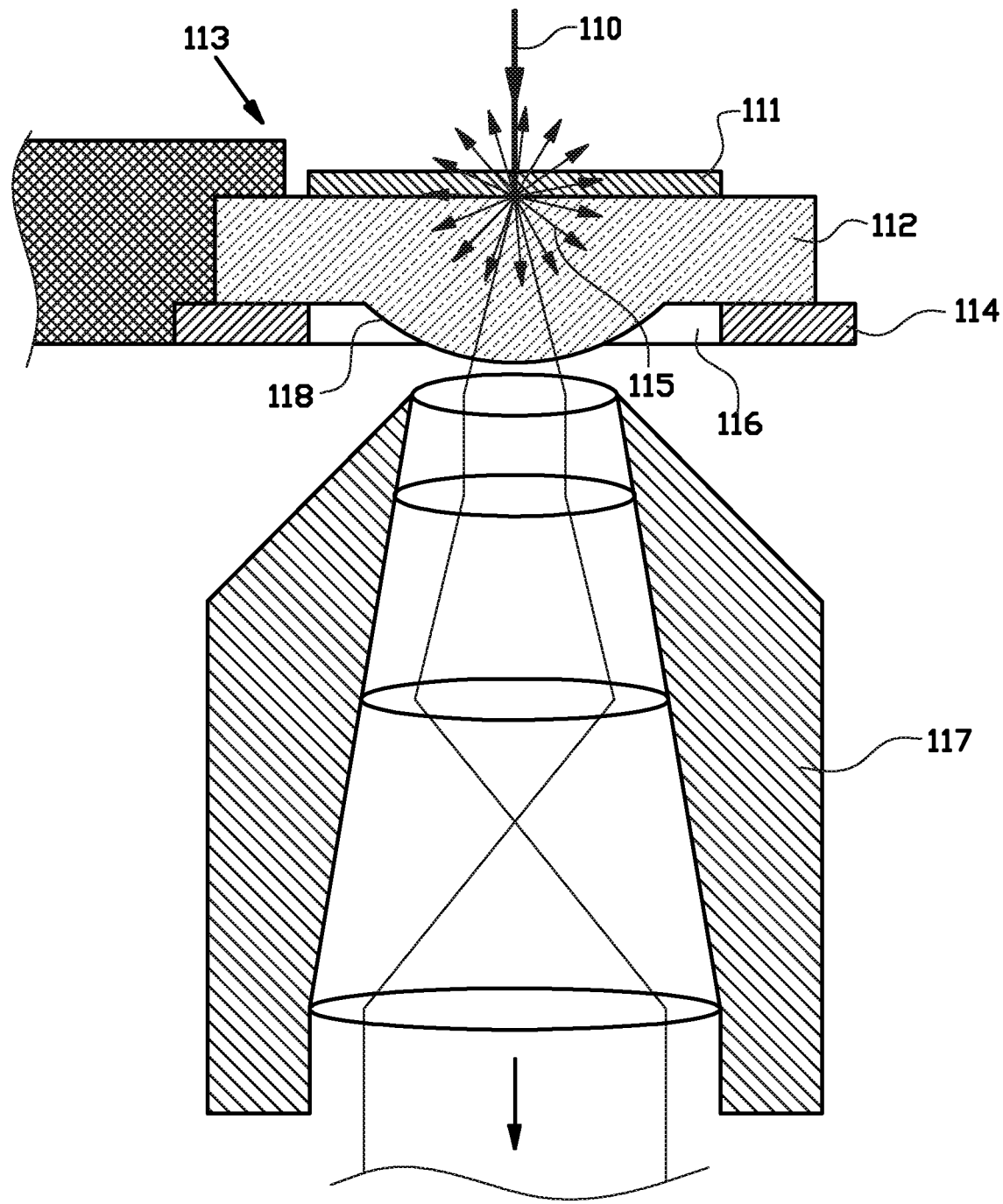

FIG. 7 schematically shows an example of a fifth embodiment of part of the sample holder 113 as improved by the present invention. The sample holder comprises a support member 114 with a slab of scintillator material 112 on top. The support member 114 is provided with a through opening 116 to provide a window for observing the sample 111 via the through opening 116 and through the scintillator material 112. The sheet or slab of the scintillator material 112 comprises a surface 118 which faces an objective lens 117 of the light optical microscope. As schematically shown in FIG. 7, the surface 118 comprises a curved surface, in particular a convex surface. Accordingly, the slab of scintillator material 112 acts as a solid immersion lens. The curved surface 118 in combination with the objective lens 117 provides an optical system with a higher Numerical Aperture (NA) when compared with an optical system without the curved surface (as for example shown in FIG. 3). Due to the increase NA more light from the sheet of scintillator material 112 can be collected by the light optical microscope and thus more faint emissions of photons from charged particles 110 which impinge on the sheet of cathodoluminescent material 112 after transmission through said sample 111 can be studied.

Figure 8:
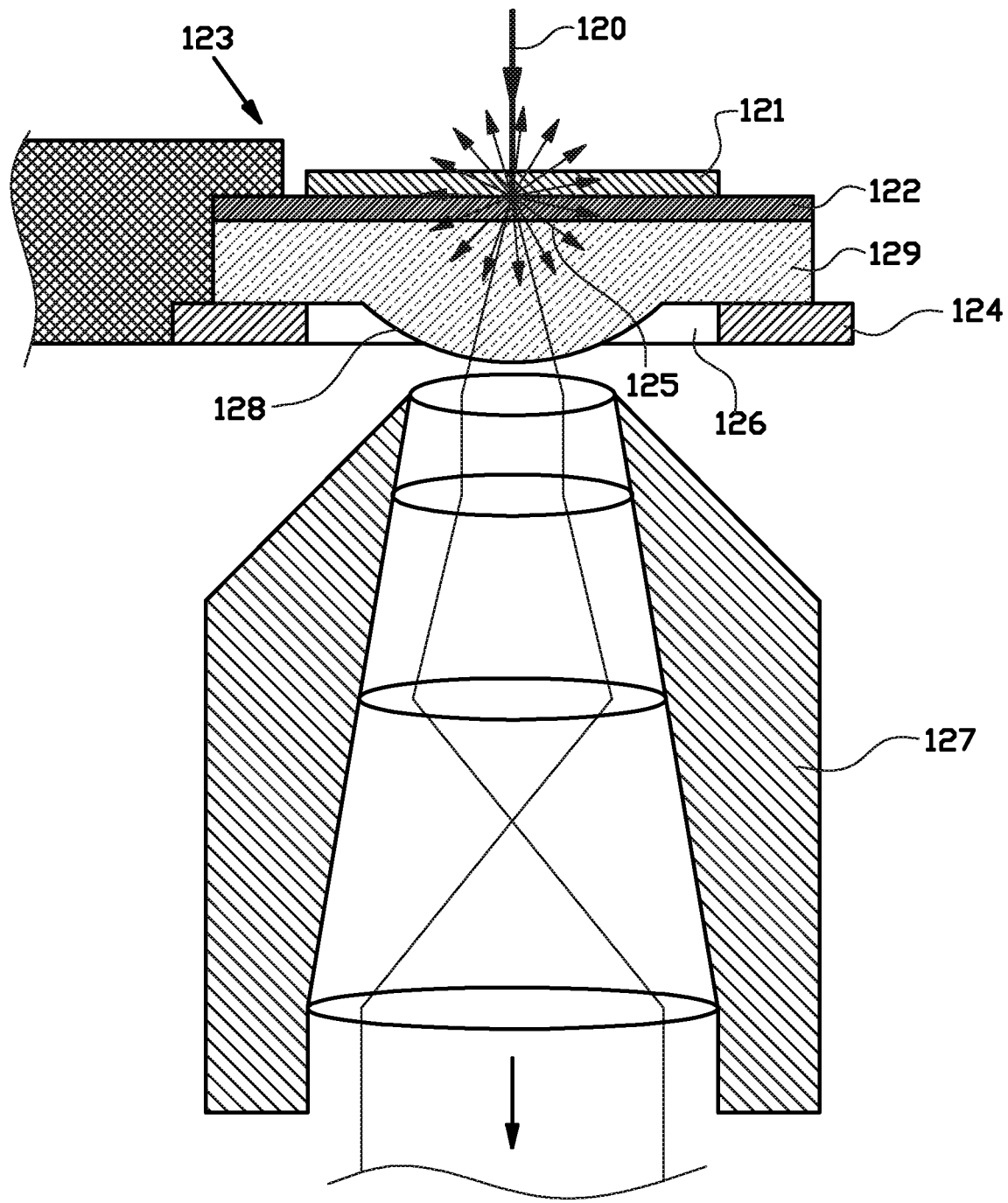

FIG. 8 schematically shows an example of a sixth embodiment of part of the sample holder 123 as improved by the present invention. Again, the sample holder comprises a support member 124 with a slab of a carrier 129 carrying a sheet of scintillator material 122 on top. The support member 124 is provided with a through opening 126 to provide a window for observing the sample 121 via the through opening 126 and through the carrier 129 with the sheet of scintillator material 122. The carrier 129 comprises a surface 128 which faces an objective lens 127 of the light optical microscope. As schematically shown in FIG. 8, the surface 128 comprises a curved surface, in particular a convex surface. Accordingly, the carrier 129 acts as a solid immersion lens. Just as in the previous example, the curved surface 128 in combination with the objective lens 127 provides an optical system with a higher Numerical Aperture (NA) when compared with an optical system without the curved surface (as for example shown in FIG. 3). Due to the increase NA more light from the sheet of scintillator material 122 can be collected by the light optical microscope and thus more faint emissions of photons from charged particles 120 which impinge on the sheet of cathodoluminescent material 122 after transmission through said sample 121 can be studied.

Figure 9A:
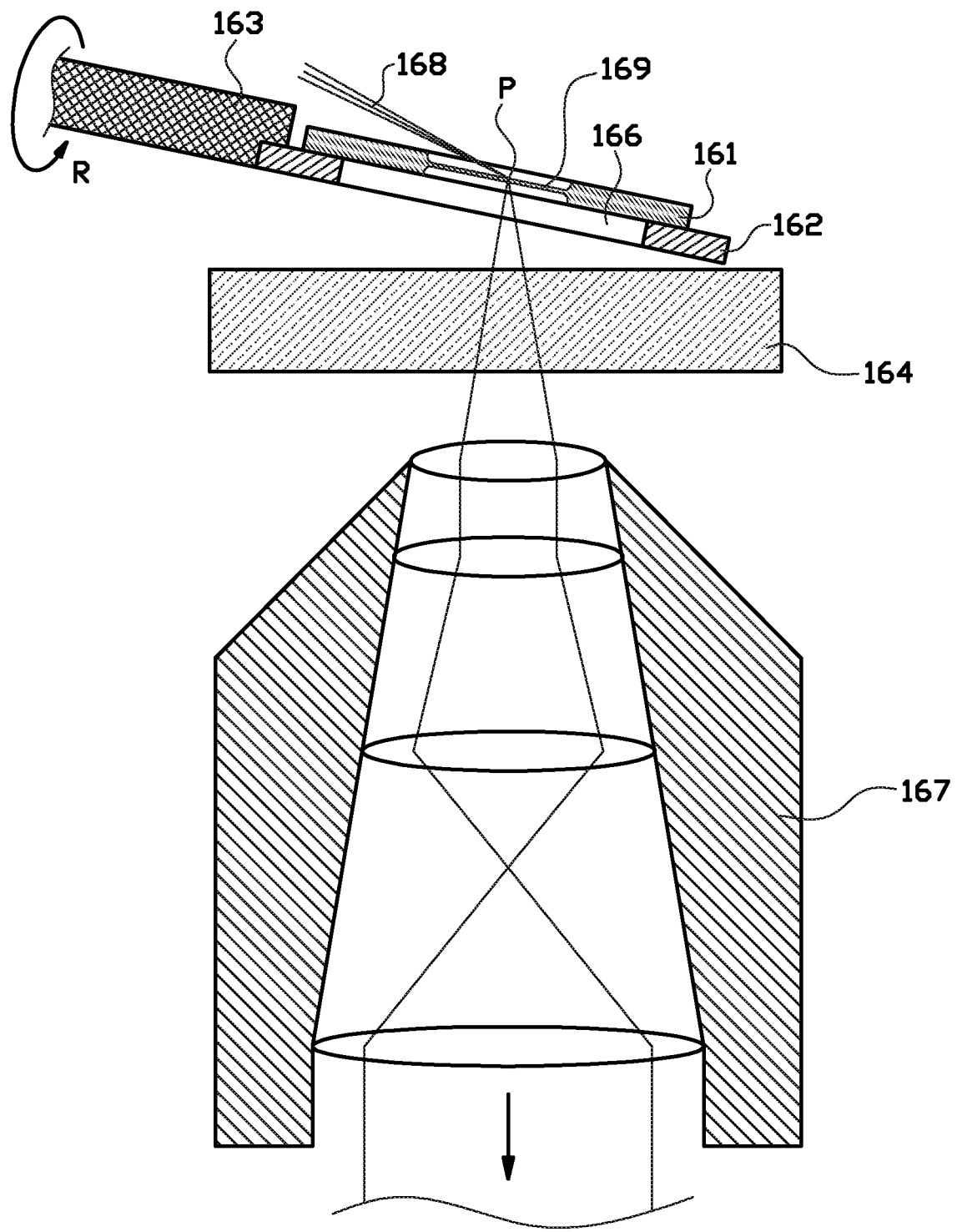

FIG. 9A schematically shows an example of an embodiment combined with a Focused Ion Beam (FIB) system for modifying or machining a sample 161. The sample holder comprises a support member 162 which is arranged for supporting a sample 161 which may suitably be provided and supported on top of a TEM sample support mesh grid (not shown). The support member 162 is provided with a through opening 166 to provide a window for observing the sample 161 via the through opening 166. Preferably, the support member 162 is made from heat conductive material and is connected to the cooling system 163. Accordingly, the support member 162 and the sample 161 can be cooled down, preferably to cryogenic temperatures.

In this exemplary embodiment, apparatus is provided with a FIB system which is configured for, at least in use, providing and directing a focused ion beam 168 towards the sample 161 on the support member 162. The focused ion beam 168 is used to modify or machine the sample 161. The focused ion beam 168 is preferably used for removing material from the sample 161 by sputtering, milling or ablation. Preferably the position P where the focused ion beam 168 impinges on the sample 161 is arranged to be observable by the light optical microscope via the microscope objective 167. Accordingly, the process of modifying or machining can be monitored using the light optical microscope. For monitoring the process of modifying or machining of the sample via the microscope objective 167, the sheet of scintillator material 164 can be at least temporarily be removed, or the sheet of scintillator material 164 is substantially transparent for allowing observation of the sample via the light optical microscope through the sheet of scintillator material 164.

Figure 9B:
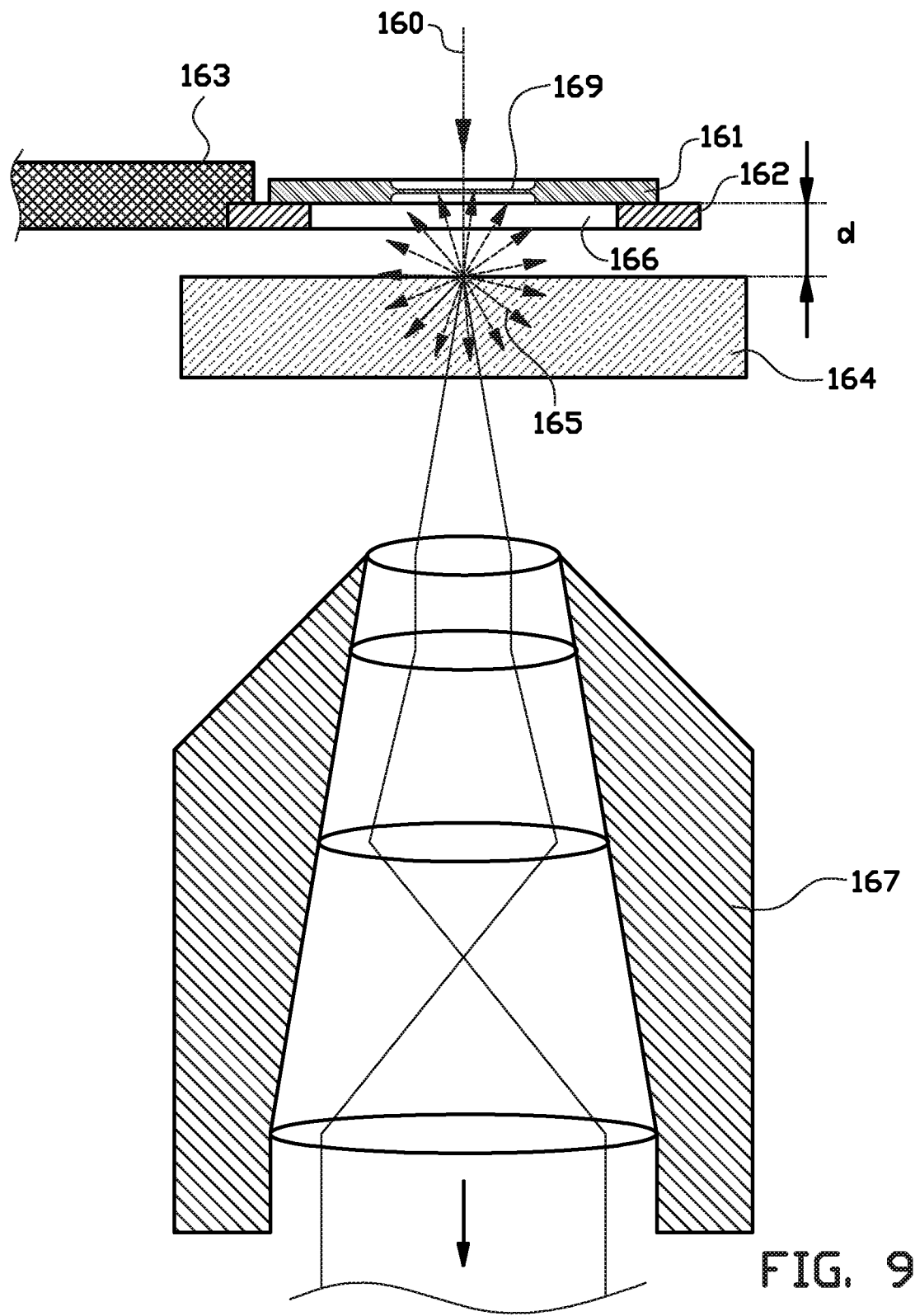

In the example shown in FIG. 9A, the focused ion beam 168 is used for producing a lamella 169. The lamella 169 is produce by using the focused ion beam 168 for removing a layer of material from both sides of the sample 161. In order to enable the focused ion beam 168 to remove material from both sides of the sample 161, the sample holder 162 and/or the cooling system 163 is/are rotatable in a rotation direction R so the focused ion beam 168 can reach both sides of the sample 161. The lamella 169 provides a cross section through the sample 161, which can be studied using the light optical microscope and/or using the beam of primary charged particles 160, as schematically shown in FIG. 9B.

Immediately after the lamella 169 has been produced by the focused ion beam 168, the lamella 169 can be studied using the beam of primary charged particles 160. When the primary charged particle beam 160 impinges onto the sample 161, in particular the lamella 169 of the sample 161, part of that primary charged particle beam 160 may by transmitted through the lamella 169 and this transmitted part impinges on the sheet of scintillator material 164, where the transmitted primary charged particles are at least partially converted into photons 165. A part of these photons travel through the sheet of scintillating material 164, and can be collected by the microscope objective 167 in order to obtain a transmission charged particle image of the lamella 169.

Accordingly, the sample 161 can be modified or machined by the focused ion beam 168, and the modified or machined parts of the sample can be studied in the same apparatus using the light optical microscope and/or using photons which are created by the focused beam of primary charged particles 160 after transmission of said primary charged particle beam through the sample 161 and which primary charged particles impinge on the sheet of scintillator material 164.

Figure 10A:
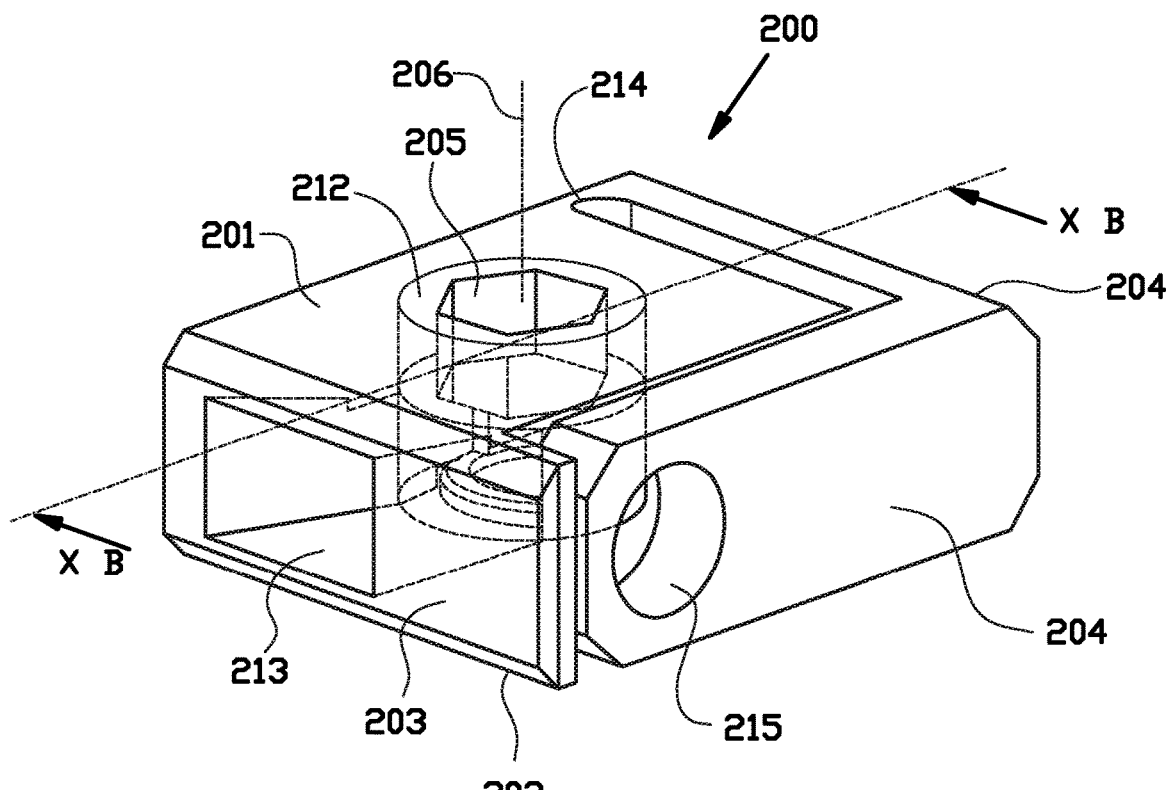
FIGS. 10A and 10B schematically show part of a sample holder.
Figure 10B:
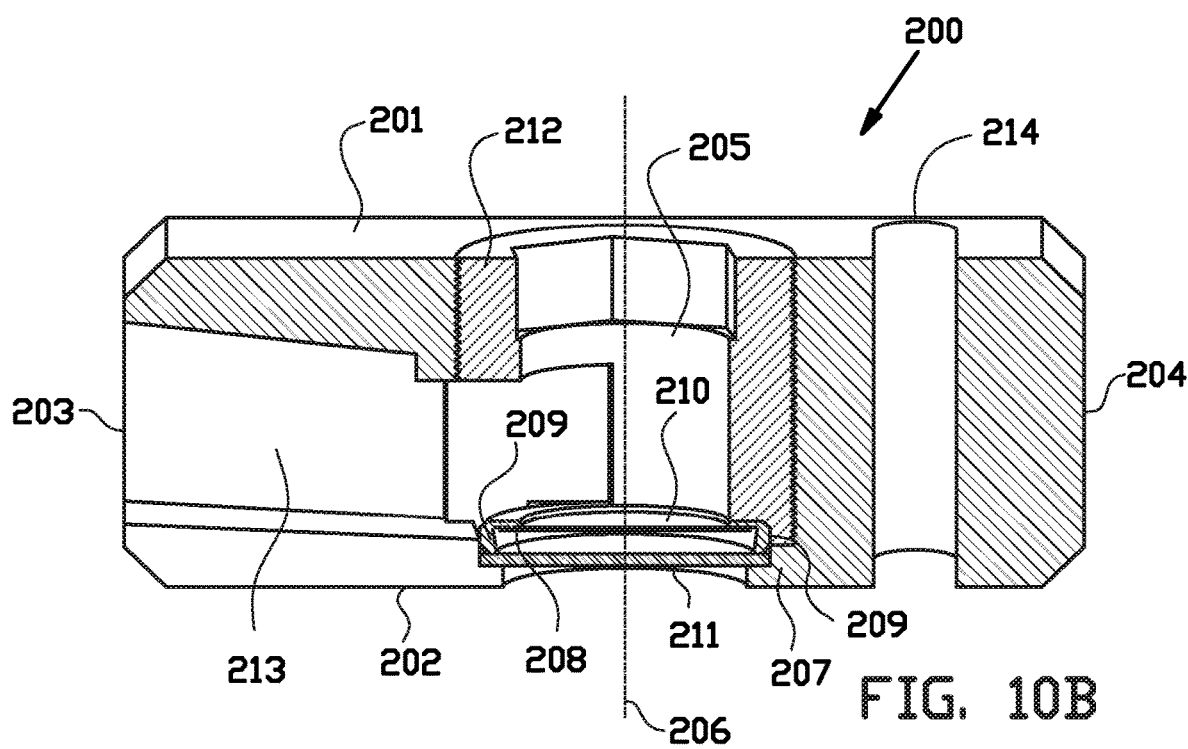

FIGS. 10A and 10B schematically show part of an example of a sample holder 200 which allows easy handling of the sample and which provides access to the sample for the various modes of operation of the apparatus of the present invention. The sample holder 200 comprises a block of material with an upper surface 201, a bottom surface 202 and side surfaces 204. The upper surface 201 and the bottom surface 202 are substantially parallel to each other. The block of material comprises a substantially cylindrical through opening 205 with a central axis 206 which in this example extends in a direction substantially perpendicular to the upper and/or lower surface.

Near the bottom surface 202, the through opening 205 is provided with a substantially circumferential rim 207. The diameter of the through opening at the rim 207 is smaller than the diameter of the through opening above the rim 207. Accordingly, the rim 207 provides a support surface for at least the sample 208.

In this example, the sample 208 comprises a ring member 209 with a central opening with a grid 210 for supporting a specimen. Between the sample 208 and the rim 207, a plate 211 of a transparent material can be arranged. The plate 211 can be a transparent glass plate or a transparent sapphire plate. Alternatively, the plate 211 can be a scintillator sheet or a carrier with a scintillator sheet at a side of the carrier facing the sample 208. Accordingly, the sample can be viewed from the bottom surface 202 via an optical microscope, for example.

In order to hold the sample 208 and the plate 211 in position, an insert member 212 is provided which fits inside the through opening 205, for example using a screw connection between an outer surface of the insert member 212 and an inner surface of the through opening 205, as schematically indicated in FIG. 10B. The insert member 212 is provided with a substantially central through opening to provide an access opening from the upper surface 201 to the sample 208. This access opening can be used for directing the focused beam of primary charged particles onto the sample 208.

As further shown in FIGS. 10A and 10B, the sample holder 200 comprises a side opening 213. Preferably, the side opening 213 can be used for placing the sample 208 in the sample holder 200. In addition, the side opening 213 also provides access to direct a focused ion beam at an oblique angle onto the sample 208

In addition, the sample holder 200 is provided with a substantially L-shaped member 204, which extends along substantially two side surfaces 204 and which is connected to the block with through opening 205 via a resilient joint 214. This L-shaped member 204 is provided with a connector 215 for a transfer rod, which connector 215 is arranged at the L-shaped member 204 at a side opposite to the resilient joint 214.

Accordingly, the sample holder 200 provides a protection for the fragile specimen inside, and serves as a carrier for a transfer from the ambient environment to the vacuum environment inside the charged particle apparatus. In addition, the sample holder 200 can act as a cryogenic shield and is configured to reduce and preferable avoid contamination of the sample during various processing steps. For example, to minimize rest gas ice growth rate at least during the cooling of the sample holder 200.

Figure 10C:
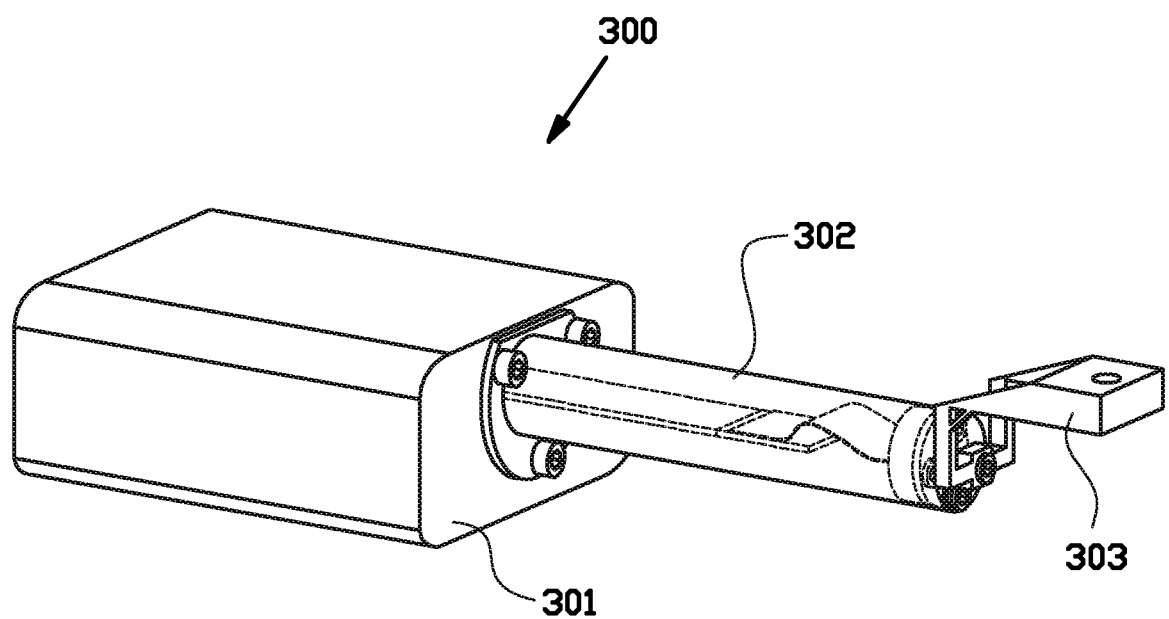
FIG. 10C schematically shows a cooling system for use with the sample holder of FIGS. 10A and 10B.

FIG. 10C schematically shows a cooling system 300 for use with the sample holder of FIGS. 10A and 10B. The cooling system 300 comprises a housing 301, a Joule-Thompson micro-cooler 302 and a receptacle 303. The receptacle 303 is configured to receive a sample holder 200 and to cool the sample holder 200 down to cryogenic temperatures. An advantage of using a Joule-Thompson cooler is, that no liquid Nitrogen or liquid Helium is required for cooling the specimen.

It is to be understood that the above description is included to illustrate the operation of the preferred embodiments and is not meant to limit the scope of the invention. From the above discussion, many variations will be apparent to one skilled in the art that would yet be encompassed by the scope of the present invention.

The invention claimed is:
1. An apparatus for inspecting a sample, wherein the apparatus comprises:
    a sample holder for holding the sample, wherein at least the sample holder comprises a cooler which is configured for cooling at least the sample;

a charged particle exposure system comprising an assembly for projecting a focused beam of primary charged particles onto the sample held by the sample holder; and a light optical microscope;

wherein the sample holder comprises a sheet of a scintillator material, wherein the sample holder is configured for positioning the sample in between the charged particle exposure system and the sheet of the scintillator material, and wherein the light optical microscope comprises a first detector configured for acquiring an image of at least a part of the sheet of the scintillator material.

2. The apparatus according to claim 1, wherein the cooler is configured for cooling the sheet of the scintillator material.

3. The apparatus according to claim 2, wherein the sheet of the scintillator material is an integral part of the cooler.

4. The apparatus according to claim 1, wherein the cooler is configured for cooling at least the sample to a temperature at or below −20° C., or below −30° C.

5. The apparatus according to claim 1, wherein the cooler is configured for cooling at least the sample to cryogenic temperatures, or to a temperature at or below −150° C.

6. The apparatus according to claim 1, wherein the sample holder is configured to position the sample in direct contact with and/or supported by said sheet of the scintillator material.

7. The apparatus according to claim 1, wherein the sample holder is configured to position the sample spaced apart from said sheet of the scintillator material.

8. The apparatus according to claim 1, wherein the sheet of the scintillator material comprises a surface which faces an objective lens of the light optical microscope, wherein said surface comprises a convex curved surface part.

9. The apparatus according to claim 1, wherein the sheet of the scintillator material is arranged on top of a carrier which is at least partially transparent, wherein the carrier comprises a surface which faces an objective lens of the light optical microscope, wherein said surface comprises a convex curved surface part.

10. The apparatus according to claim 1, wherein the charged particle exposure system comprises a charged particle microscope, an electron microscope, or a scanning electron microscope, or a Focused Ion Beam system for directing a focused ion beam to a position on the sample holder where in use the sample is arranged.

11. The apparatus according to claim 1, wherein the apparatus further comprises a Focused Ion Beam system for directing a focused ion beam to a position on the sample holder where in use the sample is arranged, wherein said position is arranged to be observable by the light optical microscope and/or the charged particle exposure system.

12. The apparatus according to claim 1, wherein the apparatus further comprises a Plasma system for directing a plasma to a position on the sample holder where in use the sample is arranged.

13. The apparatus according to claim 1, wherein the cooler comprises a Joule-Thomson cooler, a thermoelectric cooler, a pulse tube cooler, a cryostat and/or a Dewar.

14. The apparatus according to claim 1, wherein the cooler comprises a cooling device comprising:

a substantially completely enclosed cooling chamber comprising an input opening and an output opening, wherein the output opening is spaced apart from the input opening, a feed channel connected to the input opening of the cooling chamber, wherein the feed channel is configured for feeding a cooling medium to the cooling chamber, a discharge channel connected to the output opening of the cooling chamber, wherein the discharge channel is configured for discharging cooling medium from the cooling chamber, wherein the sheet of the scintillator material is arranged in heat exchanging contact with the cooling chamber.

15. The apparatus according to claim 14, wherein the sheet of the scintillator material is at least part of a wall of the cooling chamber.

16. The apparatus according to claim 14, wherein the cooling chamber comprises an evaporation chamber, wherein the cooler comprises a restriction arranged in the feed channel adjacent to the input opening of the evaporation chamber and/or arranged at least partially in the input opening of the evaporation chamber, and wherein the feed channel is configured for feeding a high pressure cooling medium.

17. A cryostage for scanning charged particle microscopy, wherein the cryostage comprises:

a sample holder for holding the sample, a cooler which is configured for cooling at least the sample; and a sheet of a scintillator material, wherein the sample holder is configured to position the sample in front of the sheet of the scintillator material, wherein the sheet of the scintillator material is arranged in heat exchanging contact with the cooler.

18. The cryostage according to claim 17, wherein the cooler comprising:

a substantially completely enclosed cooling chamber comprising an input opening and an output opening, wherein the output opening is spaced apart from the input opening, a feed channel connected to the input opening of the cooling chamber, wherein the feed channel is configured for feeding a cooling medium to the cooling chamber, a discharge channel connected to the output opening of the cooling chamber, wherein the discharge channel is configured for discharging cooling medium from the cooling chamber, wherein the sheet of the scintillator material is arranged in heat exchanging contact with the cooling chamber, and/or wherein the sheet of the scintillator material is at least part of a wall of the cooling chamber.

19. A method for inspecting a sample, wherein the method comprises the following steps:

providing an apparatus that includes a sample holder for holding the sample, wherein at least the sample holder comprises a cooler which is configured for cooling at least the sample, a charged particle exposure system comprising an assembly for projecting a focused beam of primary charged particles onto the sample held by the sample holder, and a light optical microscope,
wherein the sample holder comprises a sheet of a scintillator material, wherein the sample holder is configured to position the sample in between the charged particle exposure system and the sheet of the scintillator material,
wherein the light optical microscope comprises a first detector configured for acquiring an image of at least a part of the sheet of the scintillator material;

providing a cooled sample on the sample holder;

cooling the sample in the sample holder by means of the cooler of the sample holder; and using the light optical microscope to detect photons which are created by the focused beam of primary charged particles after transmission of said primary charged particle beam through the sample and which primary charge particles impinge on the sheet of the scintillator material.

20. The method according to claim 19, wherein the method comprises the step of:
cooling the sheet of the scintillator material by means of the cooler of the sample holder.

* * * * *